US011075332B2

United States Patent
Lang et al.

(10) Patent No.: US 11,075,332 B2
(45) Date of Patent: Jul. 27, 2021

(54) TACTILE TEMPERATURE CONTROL

(71) Applicant: Bayerische Motoren Werke Aktiengesellschaft, Munich (DE)

(72) Inventors: Franziska Lang, Ventura, CA (US); Martin Francisco, Pasadena, CA (US); Eric Brown, North Hollywood, CA (US); Matthew Potter, Porter Ranch, CA (US); Paul Ferraiolo, Ventura, CA (US)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 16/546,164

(22) Filed: Aug. 20, 2019

(65) Prior Publication Data
US 2021/0057628 A1   Feb. 25, 2021

(51) Int. Cl.
| | | |
|---|---|---|
| *G01R 23/00* | (2006.01) | |
| *H01L 35/32* | (2006.01) | |
| *G06F 1/20* | (2006.01) | |
| *G06F 3/0484* | (2013.01) | |
| *G06F 3/044* | (2006.01) | |

(52) U.S. Cl.
CPC .............. *H01L 35/32* (2013.01); *G06F 1/206* (2013.01); *G06F 3/0445* (2019.05); *G06F 3/04847* (2013.01)

(58) Field of Classification Search
CPC ... H01L 35/32; G06F 3/04847; G06F 3/0445; G06F 1/206
See application file for complete search history.

(56) References Cited

U.S. PATENT DOCUMENTS

| | | | | |
|---|---|---|---|---|
| 9,092,060 | B1* | 7/2015 | Joshi | G06F 3/016 |
| 10,457,146 | B2* | 10/2019 | Schnur | G06F 1/206 |
| 2009/0045918 | A1* | 2/2009 | Droesler | G06K 19/0717 |
| | | | | 340/10.1 |
| 2015/0228419 | A1* | 8/2015 | Fadell | G01J 5/025 |
| | | | | 307/112 |
| 2017/0325427 | A1* | 11/2017 | Straight | A01G 31/06 |
| 2019/0265829 | A1* | 8/2019 | Sato | G06F 3/01 |

OTHER PUBLICATIONS

Author: Mao Zhipeng et al.; Title: A Thermal Tactile Display Device with Multiple Heat Sources; Date: 2012; Publisher: IEEE; Pertinent pp. 192-195.*

* cited by examiner

*Primary Examiner* — Richard Tan
(74) *Attorney, Agent, or Firm* — Crowell & Moring LLP

(57) ABSTRACT

A temperature control system for a motor vehicle includes a thermotactile user interface having a plurality of adjacent thermoelectric units arranged in an array, each thermoelectric unit having a thermoelectric surface whose temperature varies with an amount of current supplied to the thermoelectric unit. A controller controls the amount of current supplied to each thermoelectric unit such that the temperature of each thermoelectric surface in the array progressively increases or decreases along the array. The system also includes a sensor system that detects a user selection of one of the thermoelectric surfaces as corresponding to a desired temperature. In response to the detected user selection, the controller controls a temperature of a temperature controlled medium of the motor vehicle, e.g., controls the vehicle's cabin climate, to match the temperature of the selected thermoelectric surface.

19 Claims, 3 Drawing Sheets

TACTILE TEMPERATURE CONTROL

FIELD OF THE INVENTION

The present invention relates generally to thermotactile temperature control devices, and in particular, to thermotactile temperature control devices that enable a user to directly perceive potential temperature options for a temperature controlled medium via touching selectable elements having corresponding temperatures.

BACKGROUND OF THE INVENTION

The typical approach to temperature control in motor vehicles, and other systems, is via a user interface having various dials, knobs, slides, buttons or the like, and a displayed number representing a target temperature. The user manipulates the dials, knobs, slides, or buttons in order to set the temperature to whatever temperature the user desires, and a temperature control system responds accordingly. For example, if the user wants to set the temperature in his/her vehicle to 65° F., the user turns a dial or presses a button until the display reads 65° F. If the user then wants to set the temperature to 71° F., the user turns the dial until the display reads 71° F. The vehicle climate control system then responds accordingly to adjust the temperature in the vehicle to 65° F. or 71° F. as it were. And while modern vehicle temperature control systems utilize multiple redundant knobs and micro-controls for maximum climate control, these increasingly customizable systems all still operate according to this same principle.

This typical approach is unnatural. Turning a knob to set the temperature to 65° F. while "65° F." is displayed as a number requires the user to estimate how 65° F. is going to feel. This approach indeed often leads to the user adjusting and then re-adjusting the target temperature as he/she realizes that 65° F. does not feel like he/she thought it would. This type of temperature control is also inherently problematic because the sensations of heat and cold are relative. To the same user, 71° F. may feel much hotter when the user is cold than when he/she is already warm. By contrast, whether something is too hot, too cold, or just right is immediately and instinctually understood accurately by touch without the need to translate numbers into sensations or otherwise intellectualize the temperature.

As such, there is a need in the art for devices, systems and methods for controlling the temperature of a temperature controlled medium that does not suffer from the above drawbacks.

SUMMARY OF THE INVENTION

Disclosed and claimed herein are devices, systems and methods for the thermotactile control of the temperature of a temperature controlled medium.

In one embodiment, a plurality of adjacent thermoelectric units is arranged in an array. Each thermoelectric unit of the array has a thermoelectric surface whose temperature varies with an amount of current supplied to the thermoelectric unit. A controller is configured to control the amount of current supplied to each thermoelectric unit such that the temperature of each thermoelectric surface in the array progressively increases or decreases along the array. A sensor is configured to detect a user selection of one of the thermoelectric surfaces. In response to the selection, a temperature control system controls a temperature of a temperature controlled medium to match the temperature of the selected thermoelectric surface.

Other objects, advantages, aspects and features of the present invention will be apparent to one skilled in the relevant art in view of the following detailed description of one or more exemplary embodiments.

BRIEF DESCRIPTION OF THE DRAWINGS

The features, objects, and advantages of the present invention will become more apparent from the detailed description, set forth below, when taken in conjunction with the drawings, in which like reference characters identify correspondingly throughout and wherein.

DETAILED DESCRIPTION OF THE PREFERRED EMBODIMENTS

Figure 1:
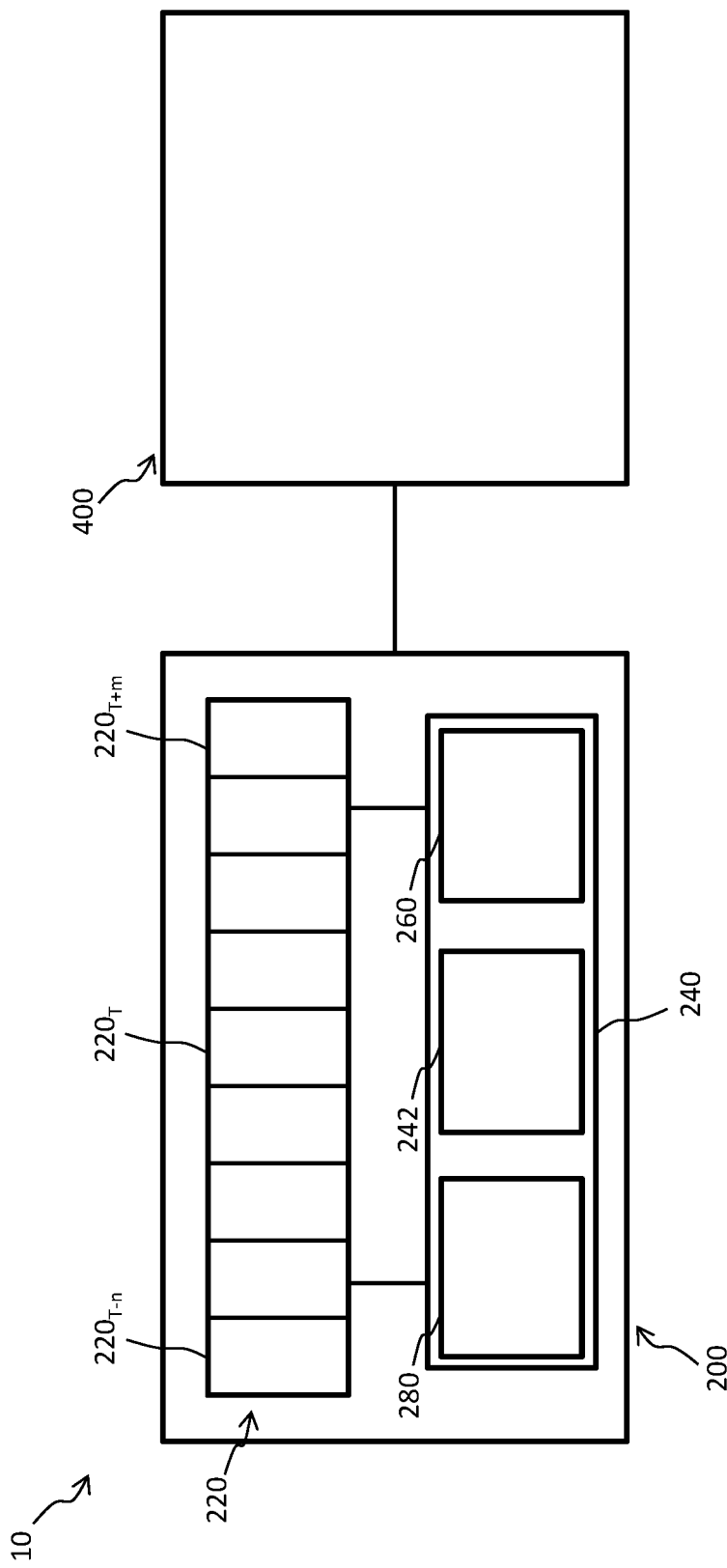
FIG. 1 is a schematic illustration of a thermotactile temperature control system according to one or more aspects of the present invention.

The above described drawing figures illustrate the present invention in at least one embodiment, which is further defined in detail in the following description. Those having ordinary skill in the art may be able to make alterations and modifications to what is described herein without departing from its spirit and scope. While the present invention is susceptible of embodiment in many different forms, there is shown in the drawings and will herein be described in detail at least one preferred embodiment of the invention with the understanding that the present disclosure is to be considered as an exemplification of the principles of the present invention, and is not intended to limit the broad aspects of the present invention to any embodiment illustrated. It will therefore be understood that what is illustrated is set forth for the purposes of example, and should not be taken as a limitation on the scope of the present invention.

The present invention generally relates to thermotactile temperature control. As used herein, the term "thermotactile" is intended to be understood as relating to the perception of temperature through touch. In general, thermotactile temperature control enables the direct perception of potential temperature options by touching selectable elements whose temperatures correspond to the potential temperatures. Once a selection is made, the temperature of a temperature controlled medium is controlled to correspond to the selected temperature. Accordingly, a more natural and instinctive selection of the target temperature may be had, based on directly feeling the temperature that the temperature controlled medium will be set to, rather than by the intellectual process of estimating the experience of selected numeric temperature values.

FIG. 1 schematically illustrates a thermotactile temperature control system 10 in accordance with at least one embodiment of the present invention. The thermotactile temperature control system 10 comprises: a thermotactile temperature control device 200 operatively coupled to a temperature control system 400.

The temperature control system 400 may include one or more temperature control sub-systems (not shown) configured to function together to regulate the temperature of a temperature controlled medium. For example, the temperature control system 400 may be a climate control system of a motor vehicle, configured to regulate the internal temperature of the motor vehicle via regulating the temperature of the air inside the motor vehicle's cabin.

Accordingly, the temperature control system 400 and/or its sub-systems may include various hardware and/or software components that, in response to receiving an electrical signal indicating a target temperature, function to regulate the temperature of the temperature controlled medium, e.g., motor vehicle cabin air, to match the target temperature. The temperature control system 400 may include, for example, one or more thermal circuits, comprising one or more of: evaporators, compressors, condensers, receivers/driers, blowers/fans, expansion devices, sensors, cooling units, heating units, pumps and/or various control units, all known in the art, configured to function accordingly.

The termotactile temperature control device 200 is coupled to the temperature control system 400, and is configured to provide, to the temperature control system 400, the electrical signal indicating the target temperature, in response to the user's thermotactile selection of the target temperature.

In general, the thermotactile temperature control device 200 may be understood as a user interface, by which the user may (1) perceive a plurality of potential temperatures directly through touch, and (2) select the target temperature from among the potential temperatures. Accordingly, the user may more naturally and instinctively select the target temperature based on directly feeling the temperature that the temperature controlled medium will be controlled to be, rather than by the intellectual process of estimating what selected numeric values for the temperature of temperature controlled medium will ultimately feel like.

The thermotactile temperature control device 200 comprises: a plurality of thermoelectric units $220_{T-n}$ to $220_{T+m}$ arranged adjacent to one another in an array 220, and operatively coupled to a control system 240, a sensor system 260, and a current source 280, each configured to effectuate the functionalities described herein.

The thermoelectric units $220_{T-n}$ to $220_{T+m}$ may be ceramic peltier units, driven by a microcontroller that adjusts an applied current/voltage and accordingly modulates the temperature. Accordingly, each of the thermoelectric units $220_{T-n}$ to $220_{T+m}$ includes a thermoelectric surface 222 whose temperature varies, in accordance with the thermoelectric effect, based on an applied current, supplied by the current source 280. Alternatively, the temperature of the thermoelectric surface 222 may vary in accordance with an applied voltage supplied by a voltage source. The hot side of the thermoelectric units $220_{T-n}$ to $220_{T+m}$ is arranged in accordance with the warm settings, and the cold side is arranged in accordance with the cold settings.

The thermoelectric units $220_{T-n}$ to $220_{T+m}$ are preferably made of thermoelectric material, such as, for example, a thermoelectric ceramic. Any other materials can be used as long as they create the peltier effect, wherein the generation of heat through induction of electrical current on one side of a thermos conductive material creates a polar temperature variance that makes the opposite side cold. Other combinations of materials such as zinc alloys or bismuth telluride can be possible, but must be determined for cost effectiveness and safety for nonhazardous human contact.

The control system 240 generally includes a controller 242. The controller 242 is configured to control the amount of current supplied from the current source 280 to each thermoelectric unit 220 such that the temperatures of the respective thermoelectric surfaces 222 correspond to the potential temperatures from which the user may select the target temperature.

Each thermoelectric unit 220 may be connected to a current source (not shown) to receive current therefrom. Preferably, each thermoelectric unit 220 is connected to its own unique current source 280. Each current source may be in turn operatively coupled to the microcontroller 242, which is configured to control the current source 280 to provide the applied current to the thermoelectric unit 220 at a current level corresponding to the desired temperature of the thermoelectric unit 220.

Figure 2:
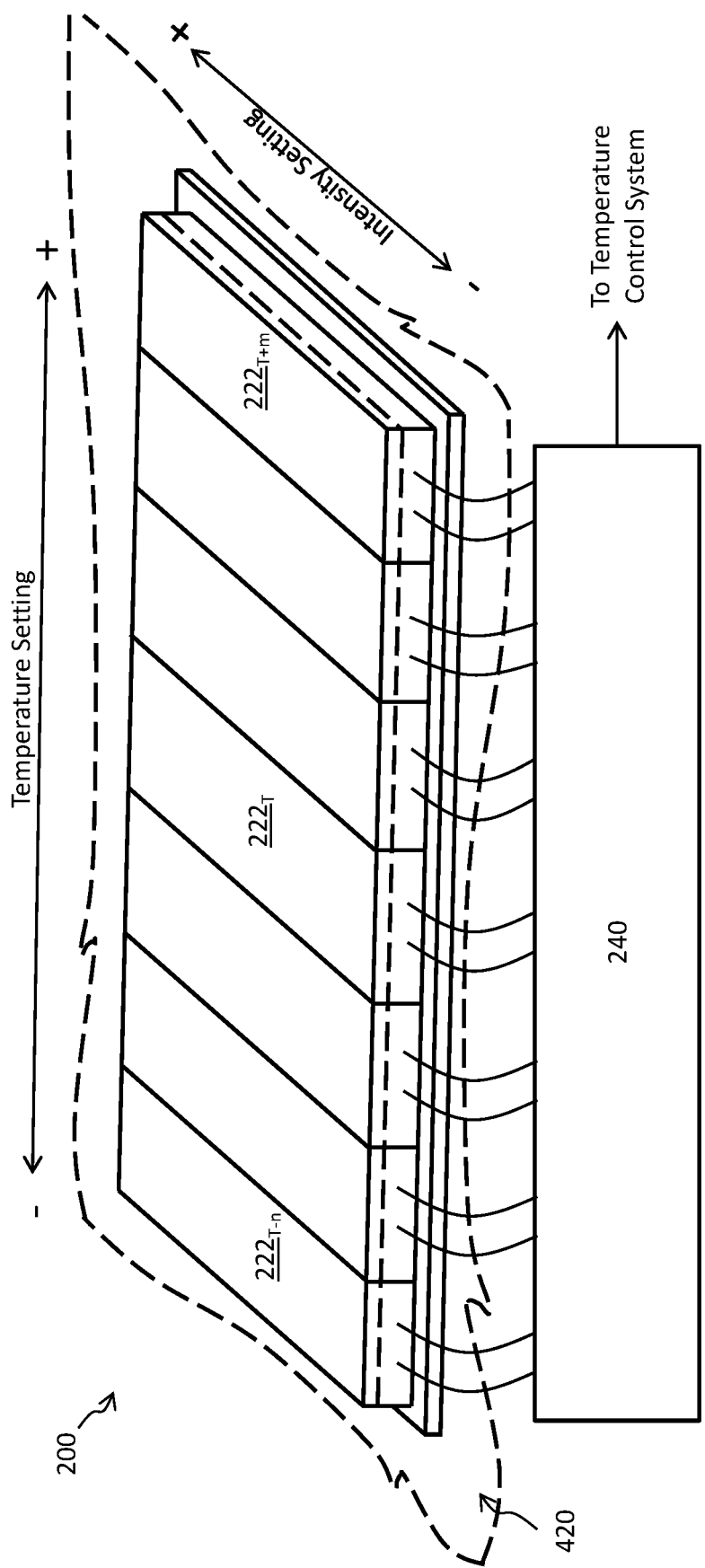
FIG. 2 is a perspective view of a thermotactile temperature control device according to one or more aspects of the present invention.

As shown in FIG. 2, in at least one embodiment, the temperature of each thermoelectric surface 222 progressively increases or decreases along the array 220 such that, as the user progressively touches adjacent thermoelectric surfaces 222 in one direction along the array 220, the effect is that the user feels progressively increasing temperature options, whereas, as the user progressively touches adjacent thermoelectric surfaces 222 in the opposite direction along the array 220, the effect is that the user feels progressively decreasing temperature options.

The sensor system 260 includes at least one sensor configured to detect a user selection of one of the thermoelectric surfaces 222 as corresponding to the target temperature, i.e., the user desired temperature for the temperature controlled medium. The thermoelectric surface may be selected by, for example, by the user swiping a finger to the selected thermoelectric surface and/or pressing the selected thermoelectric surface. Accordingly, the at least one sensor may comprise one or more proximity sensors, pressure sensors and/or other sensors positioned and configured to detect that the user has selected one of the thermoelectric surfaces 222. The selection in turn instructs the temperature control system 400 to control the temperature of the temperature controlled medium to match the temperature of the selected thermoelectric surface, i.e., the selected target temperature.

The sensor system 260 may include a touch capacitive or conductive film layer (not shown) applied to the thermoelectric surfaces 222, which may be configured to operate with the microcontroller 242 to provide x-y coordinate touch tracking functionality. The touch capacitive or conductive film layer is preferably also thermally conductive, so as to minimize interference with the temperature indications of the thermoelectric units 220.

The sensor system 260 may include one or more pressure sensors (not shown) located beneath the thermoelectric units 220, which may be configured to operate with the microcontroller 242 to provide x-y coordinate touch tracking functionality.

The sensor system 260 may include a computer vision based sensor system, in which images captured by one or more in-vehicle cameras are processed by a microprocessor to detect user action. The in-vehicle cameras may be, for example, a rearview mirror mounted face down camera, a center console camera, and/or any combination thereof.

The sensor system 260 may be configured, via one or more of the aforementioned sensors, to detect when the user's hand approaches, touches, swipes, and/or performs any relevant control gesture with respect to one or more of the thermoelectric units $220_{T-n}$ to $220_{T+m}$. The sensor system 260 may further be configured to detect a relevant activation gesture, e.g., when the users hand approaches the interface, in response to which the control system 240 may cause the thermoelectric units $220_{T-n}$ to $220_{T+m}$ activate from an inactive or off state. The sensor system 260 may further be configured to detect a relevant deactivation gesture, e.g., when the users hand departs the interface, in response to which the control system 240 may cause the thermoelectric units $220_{T-n}$ to $220_{T+m}$ deactivate from the active state. Energy usage may thereby be reduced.

Other types of sensors and positioning thereof may be utilized without departing from the scope of the invention. For example, 3D depth sensors, ultrasonic sensors, and micromovement sensors based on radio waves may additionally or alternatively be used. In some embodiments, the sensor system 260 includes a touch-sensitive layer, similar to that of a track pad or touchscreen, which detects the x-y coordinates of the users finger(s) thereon.

The thermotactile temperature control device 200 may further comprise one or more temperature sensors, which, together with the controller 242 and the current source 280, forms at least one feedback loop configured to monitor and regulate the amount of current supplied to the thermoelectric units $220_{T-n}$ to $220_{T+m}$. In particular, the temperature sensor is configured to detect the temperature of the thermoelectric surface and communicate the detected temperature to the controller 242, which in turn, based on the detected temperature, controls the amount of current supplied to the thermoelectric unit in accordance with feedback control loop principles.

In some embodiments, the controller 242 controls the temperature of each thermoelectric surface based on a reference temperature and a temperature gradient indicating the temperature difference between adjacent thermoelectric surfaces 222. Preferably, the temperature of at least one of the thermoelectric surfaces 222 corresponds to a reference thermoelectric surface $220_T$ whose temperature is controlled to be the reference temperature. Accordingly, in such embodiments, the respective temperatures of the thermoelectric surfaces 222 adjacent to the reference thermoelectric surface are controlled in accordance with the temperature gradient to be more/less than reference temperature. The reference temperature and the temperature gradient may be retrievably and updatably stored in a memory (not shown) by the controller 242.

For example, the temperature range for a new user may be set at the maximum possible range that the vehicle can achieve. Over time, machine learning algorithms executed by the control system 240 may build a user profile through data collection and biometric sensors, which tailors the temperature range based on one or more factors, including: time of day, season, past actions, behavior patterns, biometrics, etc. The goal of the machine learning algorithms is to provide the user a comfortable range of temperatures to select based on a combination of past history as well as in-the-moment circumstances.

In some embodiments, the reference temperature and the temperature gradient may be set and/or preset to predetermined values. For example, referring to FIG. 2, the reference temperature may be set to 70° F. and the temperature gradient may be set at a progressive 2° F. increase/decrease per step. The reference thermoelectric surface would therefore be 70° F. The thermoelectric surfaces $220_{T-n}$ to the left of the reference thermoelectric surface in the array 220 would then progressively step down in temperature by 2° F., whereas the thermoelectric surfaces $220_{T+m}$ to the right of the reference thermoelectric surface in the array 220 would progressively step up in temperature by 2° F.

In some embodiments, the reference temperature may be dynamically controlled to correspond to the temperature of the temperature controlled medium. Continuing with the previous example, the user may select the thermoelectric surface whose temperature is at 72° F. so as to cause the temperature of the temperature controlled medium to become 72° F. The controller 242 in turn may update the reference temperature to 72° F. and adjust the respective temperatures of the thermoelectric surfaces 222 accordingly. In other words, the temperatures of the thermoelectric surfaces 222 would all increase by 2° F.

It will be understood that the reference temperature may be initially set to a predetermined value and then subsequently controlled dynamically by the controller 242 as discussed, or vice versa. Moreover, while the temperature gradient is described herein as corresponding to a linear step gradient, other types of gradients, including non-linear and continuous gradients, are expressly contemplated.

The thermotactile temperature control system 10 may also include a heat sink 224. The heat sink 224 may be thermally coupled to the thermoelectric units $220_{T-n}$ to $220_{T+m}$ opposite their thermoelectric surfaces 222, so as to absorb and distribute waste heat/cold produced by the thermoelectric effect. By leveling out the temperature (neutralizing waste heat with waste cold) the heat sink protects surrounding electronics.

In operation, the heat sink 224 draws away waste heat for "cold touch" thermoelectric units in the array, and absorbs cold for the "hot touch" units. This allows for faster activation time of the array, efficiency in operation, and a protective measure to prevent the temperature units from being overdriven by an unexpected malfunction or surge of electrical current.

The thermotactile control system thus enables the user to perceive the plurality of potential temperatures directly by touching the thermoelectric surfaces 222, and to select the target temperature based on the touching, without the need for a numeric temperature indicator. In some embodiments, however, the thermotactile temperature control device 200 may include a non-numeric indicator, which indicates to the user the relative temperatures of the thermoelectric surfaces 222.

The non-numeric indicator may comprise a thermochromatic layer applied to the thermoelectric surfaces 222, which changes color in accordance with the temperature of the respective thermoelectric surface to which it is applied. The thermochromatic layer may be such that its color becomes progressively bluer as the temperature decreases, and progressively redder as the temperature increases. In addition or alternatively thereto, the non-numeric indicator may comprise a series of colored lights, e.g., LEDs. The colored lights may backlight the thermoelectric units $220_{T-n}$ to $220_{T+m}$ such that each thermochromatic surface is associated with progressively different colors or shades of colors, e.g., bluer light for cooler thermochromatic surfaces and redder light for warmer thermochromatic surfaces. Accordingly, an instinctual visual but non-numeric indication of temperature may be provided.

In at least one embodiment, the at least one sensor is configured to detect a gesture indicating a desired increase or decrease in a flow rate or intensity of the temperature controlled medium, e.g., a fan intensity of the motor vehicle temperature control system 400. The sensor may comprise one or more proximity sensors, pressure sensors and/or other sensors configured to detect that the user has made the gesture, which may be a swiping action perpendicular to the direction of the array 220. In response to the detected gesture, the temperature control system 400 is instructed to control the flow of the temperature controlled medium accordingly.

In at least one embodiment, the thermoelectric surfaces 222 are arranged in a linear array. Alternatively, the thermoelectric surfaces 222 may be arranged in a non-linear array, such as, for example, a circular or semi-circular array. The array 220 may also be embedded within or otherwise fixed to a surrounding surface 420, such as, for example, a dash, console or panel of the motor vehicle, for ease of use. Accordingly, the array may be arranged such that the thermoelectric surfaces 222 are substantially parallel to the surrounding surface.

Figure 3:
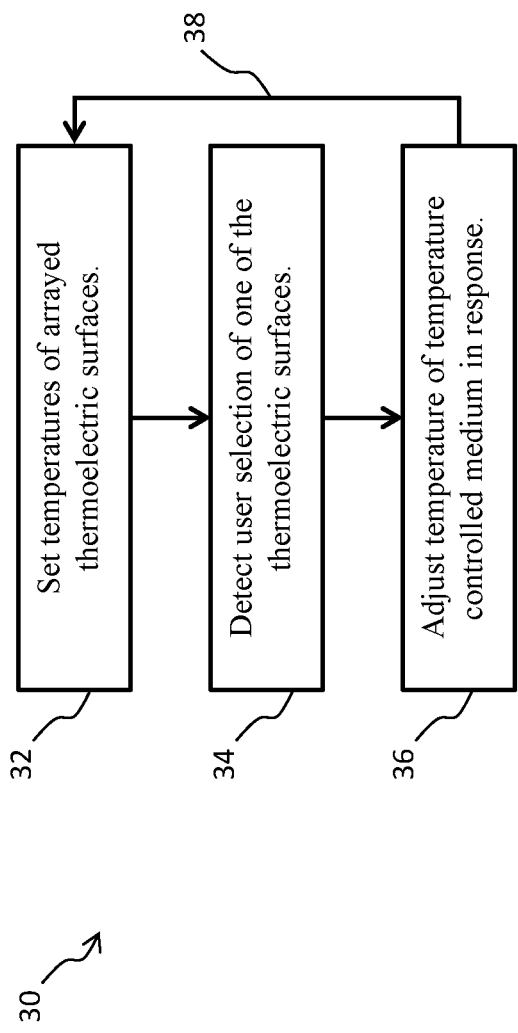
FIG. 3 is a flow diagram of various operations carried out in accordance with the principles of the present invention.

Referring now to FIG. 3, a process 30 for controlling the temperature of the temperature controlled medium in accordance with at least one embodiment will now be described. In some embodiments, process 30 may be implemented using certain components of the thermotactile temperature control system 10, as described above.

At block 32, respective temperatures of the arrayed thermoelectric surfaces 222 are set to progressively increase or decrease along the array 220. In some embodiments, this is accomplished via the control system, which controls the amount of current supplied to each thermoelectric unit such that the temperature of each thermoelectric surface progressively increases or decreases along the array 220. Thus, as the user progressively touches adjacent thermoelectric surfaces 222 in one direction along the array 220, the effect is that the user feels progressively increasing temperature options, whereas, as the user progressively touches adjacent thermoelectric surfaces 222 in the opposite direction along the array 220, the effect is that the user feels progressively decreasing temperature options.

At block 34, the user selection of one of the thermoelectric surfaces 222 is detected. In some embodiments, this is accomplished via the sensor system 260, which detects the user selection as corresponding to the user desired temperature for the temperature controlled medium. This may involve detecting a finger swipe, press, or other type of selection.

At block 36, in response to the detected user selection, the temperature of the temperature controlled medium is adjusted to the temperature of the selected thermoelectric surface. In some embodiments, this is accomplished via the temperature control system 400 regulating the temperature of the temperature controlled medium in response to receiving an electrical signal indicating the selected temperature. In at least one embodiment, the temperature control system 400 is a climate control system of a motor vehicle.

At routine 38, the process 30 may optionally return to block 32, to re-set the temperature of the arrayed thermoelectric surfaces. For example, where the temperatures of the thermoelectric surfaces 222 are set based on the current temperature of the temperature controlled medium, these set temperatures may be adjusted in accordance with adjusting the temperature controlled medium.

Accordingly, the principles of thermotactile temperature control described herein enable the direct perception of potential temperature options by touching selectable elements whose temperatures correspond to the potential temperature options. In this manner, a more natural and instinctive selection of the target temperature may be had, based on directly feeling the temperature that the temperature controlled medium will be set to, rather than by the intellectual process of estimating the experience of selected numeric temperature values. Moreover, traditional moving components, such as knobs, dials, etc., are reduced, leading to improved overall durability and cost-effectiveness.

While the present invention is described herein within the context of regulating the internal temperature of the motor vehicle, it will be understood that the principles of the present invention are applicable to regulating the temperature of any temperature controlled medium. The principles of the present invention may be applied, for example, to more instinctually regulate the internal temperature of a building via the building's HVAC system, or to regulate the temperature of objects, such as heated seats of a building, or even to regulate the temperature of liquids, such as water from a faucet. The principles of the invention may further be applied less literally to setting "light temperature," wherein emanated light from one or more light sources is controlled to be more blue toned or more red toned in accordance with the cold and hot ends of the arrayed thermoelectric surfaces.

Moreover, various elements described herein generally include hardware and/or software/firmware, including but not limited to: processors, memories, input/output interfaces, operating systems and network interfaces, configured to effectuate the functionalities described herein. When implemented in software, the elements of the invention are essentially the code segments to perform the necessary tasks. The code segments can be stored in a processor readable medium or transmitted by a computer data signal. The "processor readable medium" may include any medium that can store information. Examples of the processor readable medium include an electronic circuit, a semiconductor memory device, a ROM, a flash memory or other non-volatile memory, a floppy diskette, a CD-ROM, an optical disk, a hard disk, etc.

The objects, advantages and features described in detail above are considered novel over the prior art of record and are considered critical to the operation of at least one embodiment of the present invention and to the achievement of at least one objective of the present invention. The words used in this specification to describe these objects, advantages and features are to be understood not only in the sense of their commonly defined meanings, but also to include any special definition with regard to structure, material or acts that would be understood by one of ordinary skilled in the art to apply in the context of the entire disclosure.

As used herein, the terms "a" or "an" shall mean one or more than one. The term "plurality" shall mean two or more than two. The term "another" is defined as a second or more. The terms "including" and/or "having" are open ended (e.g., comprising). The term "or" as used herein is to be interpreted as inclusive or meaning any one or any combination. Therefore, "A, B or C" means "any of the following: A; B; C; A and B; A and C; B and C; A, B and C. An exception to this definition will occur only when a combination of elements, functions, steps or acts are in some way inherently mutually exclusive.

Reference throughout this document to "one embodiment", "certain embodiments", "an embodiment" or similar term means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner on one or more embodiments without limitation.

Moreover, the definitions of the words or drawing elements described herein are meant to include not only the combination of elements which are literally set forth, but all equivalent structures, materials or acts for performing substantially the same function in substantially the same way to obtain substantially the same result. In this sense, it is therefore contemplated that an equivalent substitution of two or more elements may be made for any one of the elements described and its various embodiments or that a single element may be substituted for two or more elements in a claim without departing from the scope of the present invention.

Changes from the claimed subject matter as viewed by a person with ordinary skill in the art, now known or later devised, are expressly contemplated as being equivalents within the scope intended and its various embodiments. Therefore, obvious substitutions now or later known to one with ordinary skill in the art are defined to be within the scope of the defined elements. This disclosure is thus meant to be understood to include what is specifically illustrated and described above, what is conceptually equivalent, what can be obviously substituted, and also what incorporates the essential ideas.

The scope of this description is to be interpreted in conjunction with the appended claims.

What is claimed is:

1. A thermotactile temperature control device, comprising:
   a plurality of adjacent thermoelectric units arranged in an array, each thermoelectric unit having a thermoelectric surface whose temperature varies with an amount of current supplied to the thermoelectric unit;
   a controller configured to control the amount of current supplied to each thermoelectric unit, in accordance with a reference temperature and a temperature gradient, such that the temperature of each thermoelectric surface in the array progressively increases or decreases along the array;
   a sensor configured to detect a user selection of one of the thermoelectric surfaces, which instructs a temperature control system to control a temperature of a temperature controlled medium to match the temperature of the selected thermoelectric surface; and
   a heat-sink thermally coupled to the plurality of thermoelectric units opposite the respective thermoelectric surfaces of the plurality of thermoelectric units,
   wherein the controller is further configured to dynamically set the reference temperature to match the temperature of the temperature controlled medium.

2. The thermotactile temperature control device of claim 1, wherein the array is a linear array.

3. The thermotactile temperature control device of claim 1, wherein the sensor includes a proximity sensor and/or a pressure sensor.

4. The thermotactile temperature control device of claim 1, further comprising at least one non-numeric visual indicator that indicates the relative temperatures of each thermoelectric surface.

5. The thermotactile temperature control device of claim 1, wherein the thermoelectric surface includes a thermochromatic layer that changes color in accordance with the temperature of the thermoelectric surface.

6. The thermotactile temperature control device of claim 1, further comprising a temperature feedback loop, the temperature feedback loop including:
   a temperature sensor configured to detect the temperature of the thermoelectric surface, wherein the controller controls the amount of current supplied to each thermoelectric unit based on the detected temperature of the thermoelectric surface.

7. The thermotactile temperature control device of claim 1, wherein the reference temperature is a preset temperature.

8. The thermotactile temperature control device of claim 1, wherein the reference temperature is the temperature of the temperature controlled medium.

9. The thermotactile temperature control device of claim 1, wherein the array of thermoelectric surfaces includes a reference thermoelectric surface whose temperature is controlled by the controller to correspond to the reference temperature.

10. The thermotactile temperature control device of claim 9,
    wherein the temperature of each thermoelectric surface to one side of the reference thermoelectric surface along the array is controlled by the controller to progressively increase according to the temperature gradient, and
    wherein the temperature of each thermoelectric surface to an opposite side of the reference thermoelectric surface along the array is controlled by the controller to progressively decrease according to the temperature gradient.

11. The thermotactile temperature control device of claim 1, wherein the temperature gradient is linear.

12. The thermotactile temperature control device of claim 1, wherein the sensor is further configured to detect a user gesture indicating a desired change in a flow of the temperature controlled medium and to instruct the temperature control system to control the flow of the temperature controlled medium in accordance with the detected user gesture.

13. The thermotactile temperature control device of claim 1, wherein the temperature controlled medium is air inside a motor vehicle, such that via operation of the thermotactile temperature control device, the climate inside the motor vehicle is controlled.

14. The thermotactile temperature control device of claim 1, wherein the temperature controlled medium is air inside a building, such that via operation of the thermotactile temperature control device, the climate inside the building is controlled.

15. The thermotactile temperature control device of claim 1, wherein the temperature controlled medium is a liquid, such that via operation of the thermotactile temperature control device, the temperature of the liquid is controlled.

16. A motor vehicle, comprising:
    a thermotactile user interface, including a plurality of adjacent thermoelectric units arranged in an array, each thermoelectric unit having a thermoelectric surface whose temperature varies with an amount of current supplied to the thermoelectric unit;
    a heat-sink thermally coupled to the plurality of thermoelectric units opposite the respective thermoelectric surfaces of the plurality of thermoelectric units;
    a sensor system configured to detect a user selection of one of the thermoelectric surfaces; and
    a controller configured to:
       control the amount of current supplied to each thermoelectric unit, in accordance with a reference temperature and a temperature gradient, such that the temperature of each thermoelectric surface in the array progressively increases or decreases along the array,
       in response to the detected user selection, control a temperature of a temperature controlled medium of the motor vehicle to match the temperature of the selected thermoelectric surface, and
       dynamically set the reference temperature to match the temperature of the temperature controlled medium.

17. The motor vehicle of claim 16, wherein the temperature controlled medium is cabin air, such that via operation of the thermotactile temperature control device, the climate inside the motor vehicle is controlled.

18. A method for controlling the temperature of a temperature controlled medium, the method comprising:
  setting respective temperatures of arrayed thermoelectric surfaces of respective thermoelectric units, in accordance with a reference temperature and a temperature gradient, to progressively increase or decrease along the array;
  sinking heat and/or cold into a heat-sink thermally coupled to the plurality of thermoelectric units opposite the respective thermoelectric surfaces;
  detecting a user selection of one of the thermoelectric surfaces;
  adjusting the temperature of the temperature controlled medium to the temperature of the selected thermoelectric surface, in response to the detected user selection; and
  dynamically setting the reference temperature to match the temperature of the temperature controlled medium.

19. The method of claim 18, wherein the temperature controlled medium is cabin air, such that, via the method, the climate inside the motor vehicle is controlled.

* * * * *